United States Patent
Lo et al.

[11] Patent Number: 6,043,864
[45] Date of Patent: Mar. 28, 2000

[54] ALIGNMENT METHOD AND APPARATUS USING PREVIOUS LAYER CALCULATION DATA TO SOLVE CRITICAL ALIGNMENT PROBLEMS

[75] Inventors: Yi-Chuan Lo; Chih-hsiung Lee, both of Hsin-Chu, Taiwan

[73] Assignee: Taiwan Semiconductor Manufacturing Company, Hsin-Chu, Taiwan

[21] Appl. No.: 09/263,542

[22] Filed: Mar. 8, 1999

[51] Int. Cl.[7] .............................. G03B 27/42; G01B 11/00
[52] U.S. Cl. .............................. 355/53; 356/400; 356/401
[58] Field of Search .............................. 355/53; 356/399, 356/400, 401; 430/22

[56] References Cited

U.S. PATENT DOCUMENTS

| | | | |
|---|---|---|---|
| 4,780,617 | 10/1988 | Umatate et al. | 250/548 |
| 5,153,678 | 10/1992 | Ota | 356/401 |
| 5,403,754 | 4/1995 | Jackson | 437/8 |
| 5,733,711 | 3/1998 | Juengling | 430/312 |
| 5,740,065 | 4/1998 | Jang et al. | 364/488 |
| 5,792,580 | 8/1998 | Tomimatu | 430/22 |
| 5,859,690 | 1/1999 | Tuguchi | 355/53 |
| 5,909,030 | 6/1999 | Yoshitake et al. | 355/53 |

*Primary Examiner*—Alan A. Mathews
*Attorney, Agent, or Firm*—George O. Saile; Stephen B. Ackerman; Larry J. Prescott

[57] ABSTRACT

An method and apparatus for aligning a mask to a wafer for photolithographic processing steps which does not use optical alignment. Each wafer is provided a unique identification code, such as a bar code. As wafers are processed through photolithographic steps where optical detection of an alignment mark can be easily accomplished the alignment data for each wafer is stored in a memory unit. At the next photolithographic step a detector reads the identification code and identifies the wafer being processed. The wafer identification is fed to a data processing unit which retrieves the alignment data for that wafer fro the memory unit. The data processing unit then feed alignment data to a mechanical controller which positions the wafer relative to the mask image being used in the photolithographic step.

20 Claims, 8 Drawing Sheets

ALIGNMENT METHOD AND APPARATUS USING PREVIOUS LAYER CALCULATION DATA TO SOLVE CRITICAL ALIGNMENT PROBLEMS

BACKGROUND OF THE INVENTION (1) Field of the Invention

This invention relates the alignment of a mask to a wafer during photolithographic processing and more particularly to alignment of a mask to a wafer without using optical alignment.

(2) Description of the Related Art

Alignment of mask images to integrated circuit wafers is critical in photolithographic processing of integrated circuit wafers. This alignment is usually performed with reference to alignment marks formed in the wafer. Detection of these alignment marks after a number of process steps can become difficult and time consuming.

U.S. Pat. No. 5,403,754 to Jackson describes a method of alignment of a number of layers so that the alignment of each layer is optimized with respect to the other layers.

U.S. Pat. No. 5,740,065 to Jang et al. describes a method of processing semiconductor wafers which averages data from a number of previous steps and extracts correction conditions for succeeding steps.

U.S. Pat. No. 5,733,711 to Juengling describes a method of forming both fixed and variable patterns on a single photoresist layer.

U.S. Pat. No. 5,792,580 to Tomimatu describes a method of aligning a mask to a wafer by defining shot regions on the wafer and a laser step alignment mark is formed in each shot region.

U.S. Pat. No. 5,153,678 to Ota describes a method of aligning a mask to a wafer.

U.S. Pat. No. 4,780,617 to Umatate et al. describes a method of aligning a mask to a wafer.

SUMMARY OF THE INVENTION

In the fabrication of integrated circuit wafers it is necessary to perform several different photolithographic steps with other process steps between the photolithographic process steps. The photolithographic process steps are uses to expose a mask pattern on a layer of photoresist formed on an integrated circuit wafer and must be aligned to patterns formed on the wafer during previous photolithographic steps. Conventionally this alignment is performed using optical alignment of alignment marks formed on the wafer. This optical alignment is often automated with the projection system, such as a projection stepper, used to project the mask images on the layer of photoresist also being used to accomplish the optical alignment of the mask to the wafer.

There are often problems with the optical alignment of the mask to the wafer. At certain stages of the fabrication of the integrated circuit wafer the contrast between the alignment marks and the region surrounding the alignment marks may be very low making alignment, especially automatic alignment difficult. Some wafer planarization operations such as chemical mechanical polishing can leave the alignment marks nearly invisible making alignment difficult. These problems can result in alignment failure and high yield loss during the fabrication of the integrated circuit wafers.

It is a principle objective of this invention to provide an alignment method for aligning an integrated circuit wafer to a mask which uses mechanical alignment only and does not use optical alignment.

It is another principle objective of this invention to provide an apparatus for aligning an integrated circuit wafer to a mask which uses mechanical alignment only and does not use optical alignment.

These objectives are achieved by using an alignment system which comprises, a mechanical controller controlled by data inputs, a data processing unit, a memory unit, and detector capable of determining the unique wafer identification code formed on each integrated circuit wafer. Prior to the difficult alignment steps, the alignment data for the previous alignment steps of each wafer are stored in the memory unit. During the difficult alignment step the each wafer is placed in the wafer holder and positioned using either a wafer flat edge or alignment notch for alignment to the wafer holder. The detector then reads the unique identification code and feeds the data to the data processing unit which retrieves the alignment data for the preceding alignment steps, for the wafer being processed, from the memory unit. The processor then feeds data to the mechanical controller which mechanically aligns the wafer to the mask, without the use of optical alignment or reliance on alignment marks.

DESCRIPTION OF THE PREFERRED EMBODIMENTS

Figure 1:
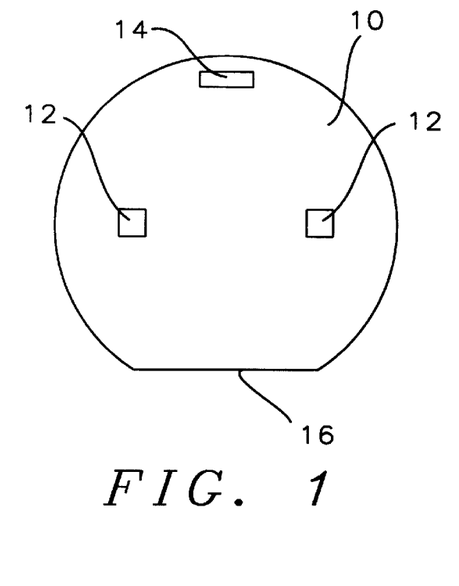
FIG. 1 shows a top view of an integrated circuit wafer having a unique identification code, alignment marks, and an alignment flat edge.
Figure 2:
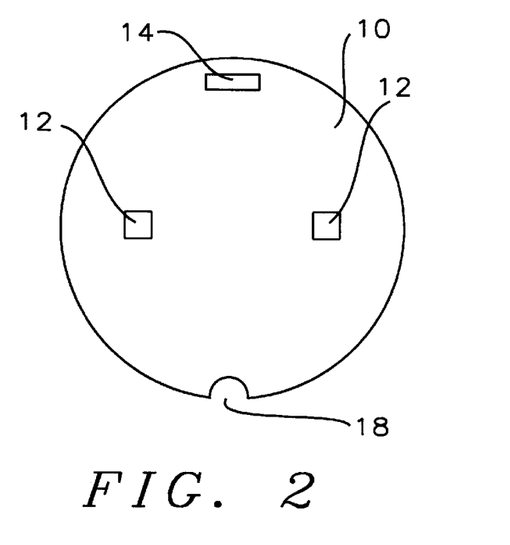
FIG. 2 shows a top view of an integrated circuit wafer having a unique identification code, alignment marks, and an alignment notch.

Refer now to FIGS. 1–5 for a description of the method and apparatus of this invention for aligning an integrated circuit wafer to a mask image during photolithographic processing steps. FIG. 1 shows a top view of a wafer 10 having two alignment marks 12, a unique identification code 14 formed on the wafer, and a flat edge 16 of the wafer used for mechanical positioning of the wafer in a wafer holder during various process steps. FIG. 2 shows a top view of another wafer 10 having two alignment marks 12, a unique identification code 14 formed on the wafer, and a notch 18 at the edge of the wafer used for mechanical positioning of the wafer in a wafer holder during various process steps. In these examples the unique identification code 14 is a bar code. The unique identification code 14 provides identification for each wafer.

Figure 3:
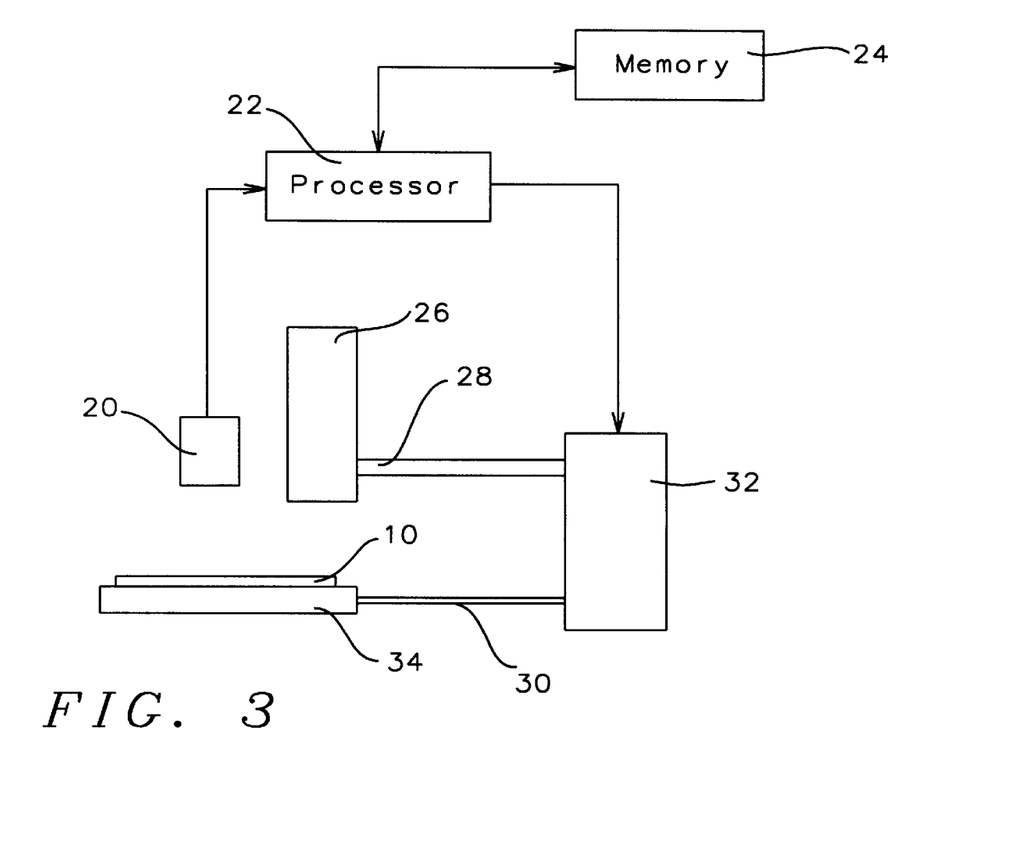
FIG. 3 shows a schematic view of a wafer alignment and exposure system for this invention.

FIG. 3 shows a schematic diagram of the apparatus of this invention used for alignment of a wafer during the projection of an image onto a layer of photoresist formed on a wafer. FIG. 3 shows a wafer holder 34 holding an integrated circuit wafer 10 which has been positioned on the wafer using the physical alignment feature of the wafer, such as a flat edge 16 shown in FIG. 1 or a notch 18 shown in FIG. 2. FIG. 3 shows a detector unit 20, a mask image projection unit 26, and a mechanical controller 32. The detector 20 is able to detect the unique identification code and feed data providing identification of the wafer in the wafer holder to a data processing unit 22 which is connected to a memory unit 24. The data processing unit 22 is connected to a data input of a mechanical controller 32. The mechanical controller 32 has a mechanical connection 30 to the wafer holder 34 and positions the wafer holder 34 in response to data supplied to the data input of the mechanical controller 32. Although the usual alignment method positions the wafer holder only, the mechanical controller 32 can also have a mechanical connection 28 to the mask image projection unit 26 and position the mask image projection unit 26 in response to data supplied to the data input of the mechanical controller 32.

Figure 4:
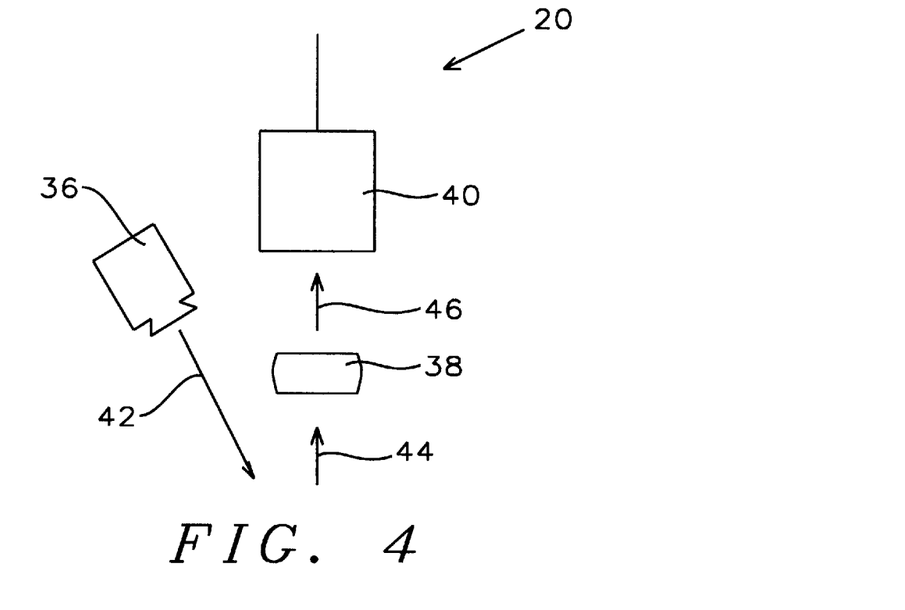
FIG. 4 shows a schematic view of a detector used to detect the unique identification code.

FIG. 4 shows a schematic diagram showing a more detailed view of the detector 20. The detector has a light source 36 supplying light 42 to the wafer in the wafer holder. An objective lens 38 is focussed on the unique identification code and a light beam 44 containing the identification code image passes through the objective lens 38. The light 46 exiting the objective lens 38 is directed to a detection unit 40, such as a CCD device, which converts the image in the light beam 46 to digital data, which is directed to the data processing unit.

Figure 5:
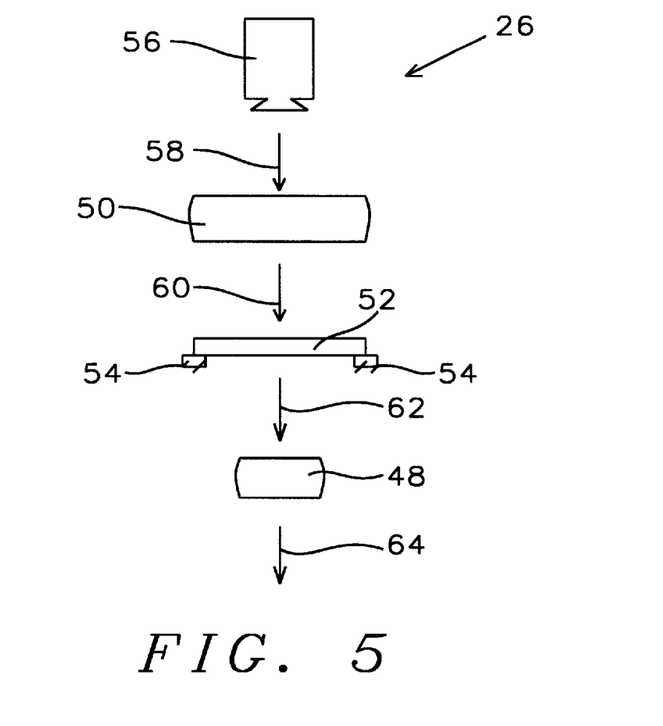
FIG. 5 shows a schematic view of a projection system used to project a mask image on a wafer.

FIG. 5 shows a schematic diagram showing a more detailed view of the mask image projection unit 26. The mask image projection unit 26 comprises a light source 56, a condenser lens 50, a mask holder 54, and on objective lens 48. A mask 52 is placed in the mask holder 54. Light 58 from the light source 56 passes through the condenser lens 50 and light 60 exiting the condenser lens passes through the mask 52. The light 62 exiting the mask 52 passes through the objective lens 48. The light 64 exiting the objective lens 48 is directed to the wafer being processed so that the objective lens 48 focusses the image of the mask 52 on the wafer.

As wafers are processed through early photolithographic processing steps using the alignment marks 12, see FIGS. 1 and 2, alignment data for each wafer are stored in the memory unit, see FIG. 3. During processing of photolithographic processing steps where use of the alignment marks 12 is difficult or time consuming the following procedure of this invention is used. Referring to FIG. 3, a wafer 10 is placed in the wafer holder 34 and the detector unit 20 identifies the wafer in the wafer holder and feeds the wafer identification data to the data processing unit 22. The data processing unit retrieves the alignment data for the previous alignment step, for the wafer in the wafer holder, from the memory unit 24. The data processing unit 24 then feed alignment data to the mechanical controller 32 and the mechanical controller adjusts the relative alignment between the wafer 10 and the mask in mask image projection unit 26 either by positioning the wafer holder 34, the mask image projection unit 26, or both. In the method of this invention using the apparatus of this invention the alignment is performed using alignment data from the previous alignment step and no optical alignment is used. This alignment method overcomes problems of optical detection of an alignment mark, saves processing time, and provides good alignment.

FIGS. 6–11 show results of the method and apparatus of this invention for 24 wafers for scaling in the X direction, scaling in the Y direction, offset in the X direction, offset in the Y direction, orthogonality, and rotation. FIGS. 6–11 show the scaling in the X direction, scaling in the Y direction, offset in the X direction, offset in the Y direction, orthogonality, and rotation required for perfect alignment for the alignment step prior to the step of this invention and for the alignment step using the method of this invention. The alignment step prior to the step of this invention uses optical alignment and the alignment step of this invention does not use optical alignment.

Figure 6:
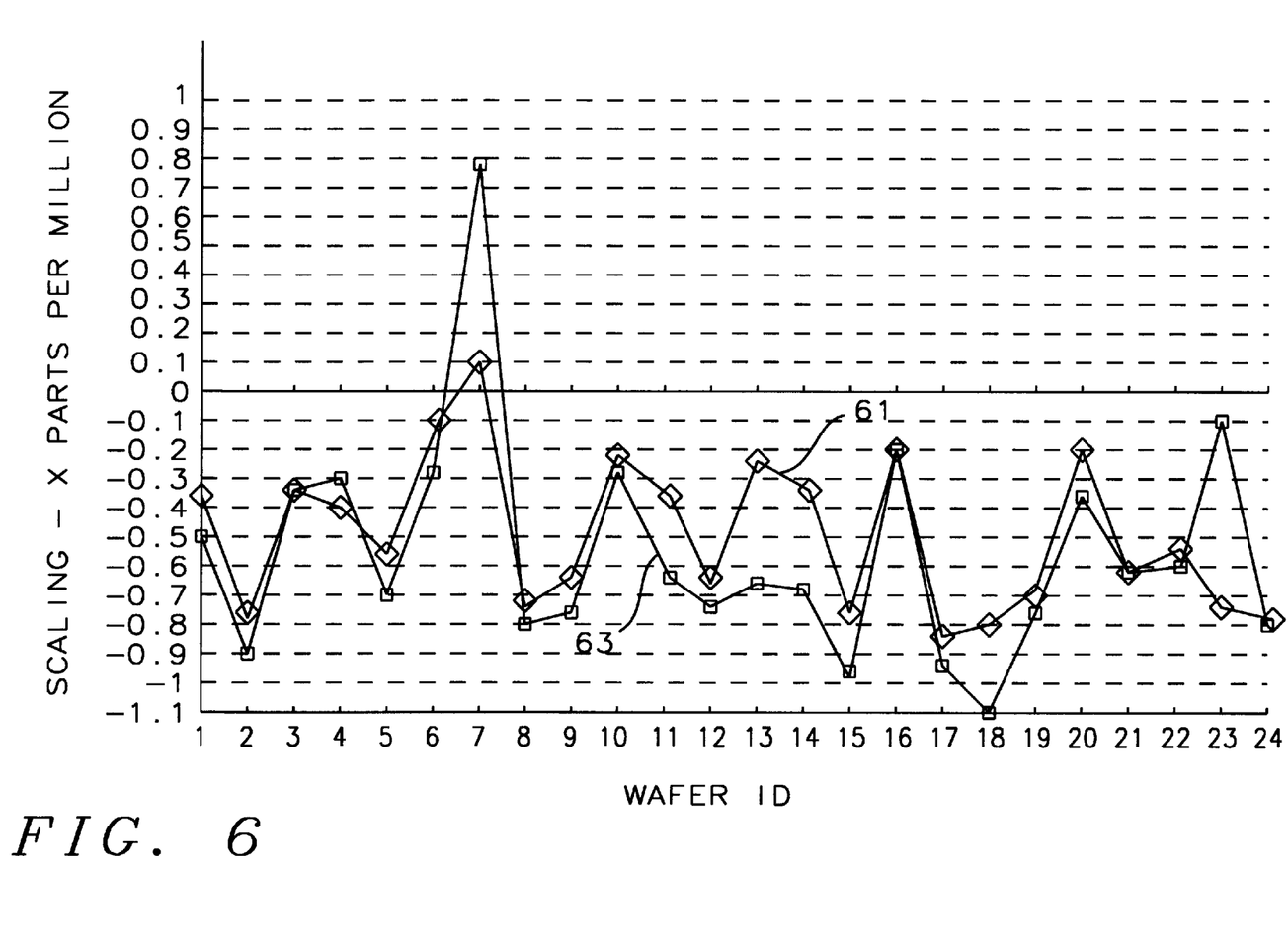
FIG. 6 shows scaling data in the X direction for 24 wafers processed using the apparatus and method of this invention.
Figure 7:
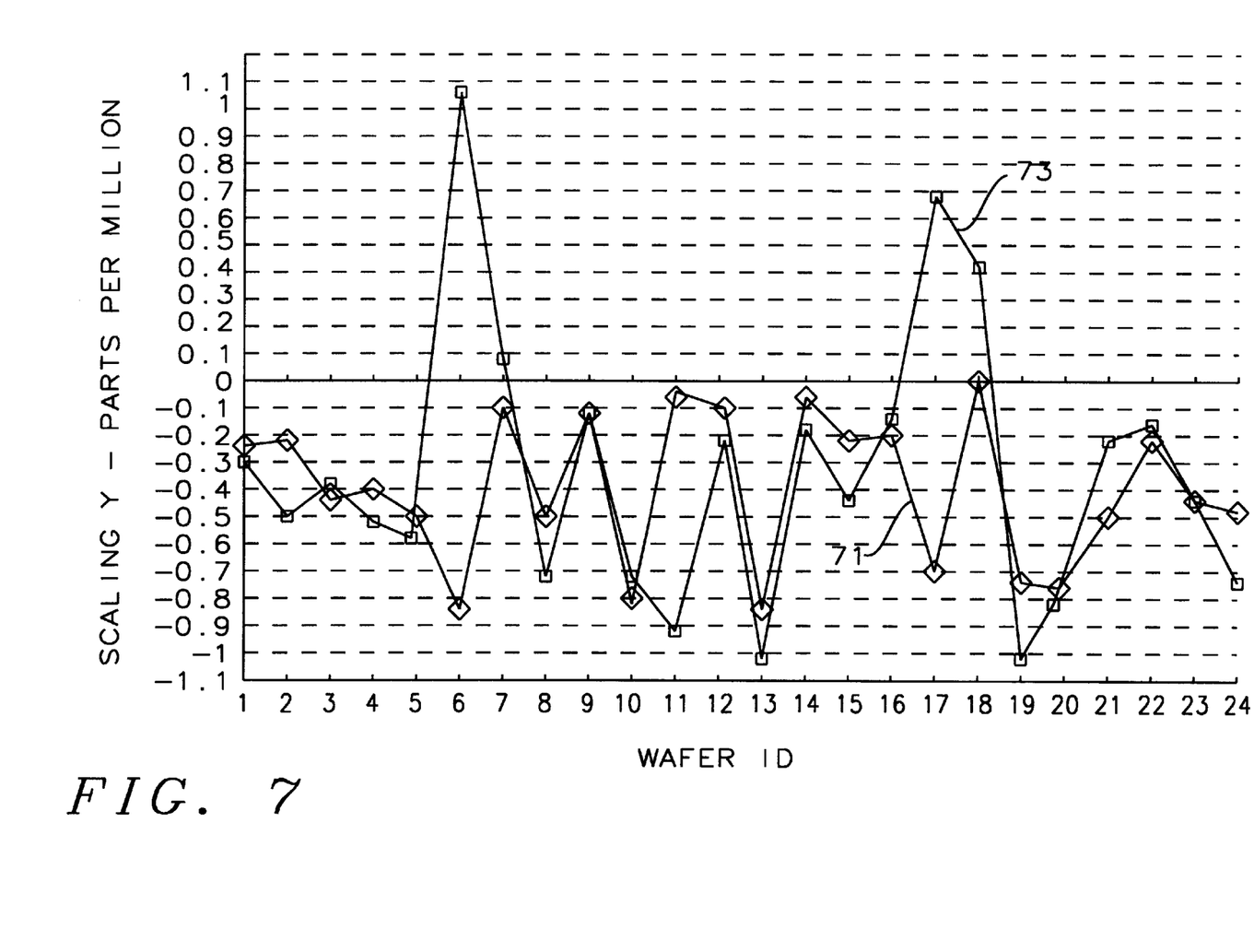
FIG. 7 shows scaling data in the Y direction for 24 wafers processed using the apparatus and method of this invention.
Figure 8:
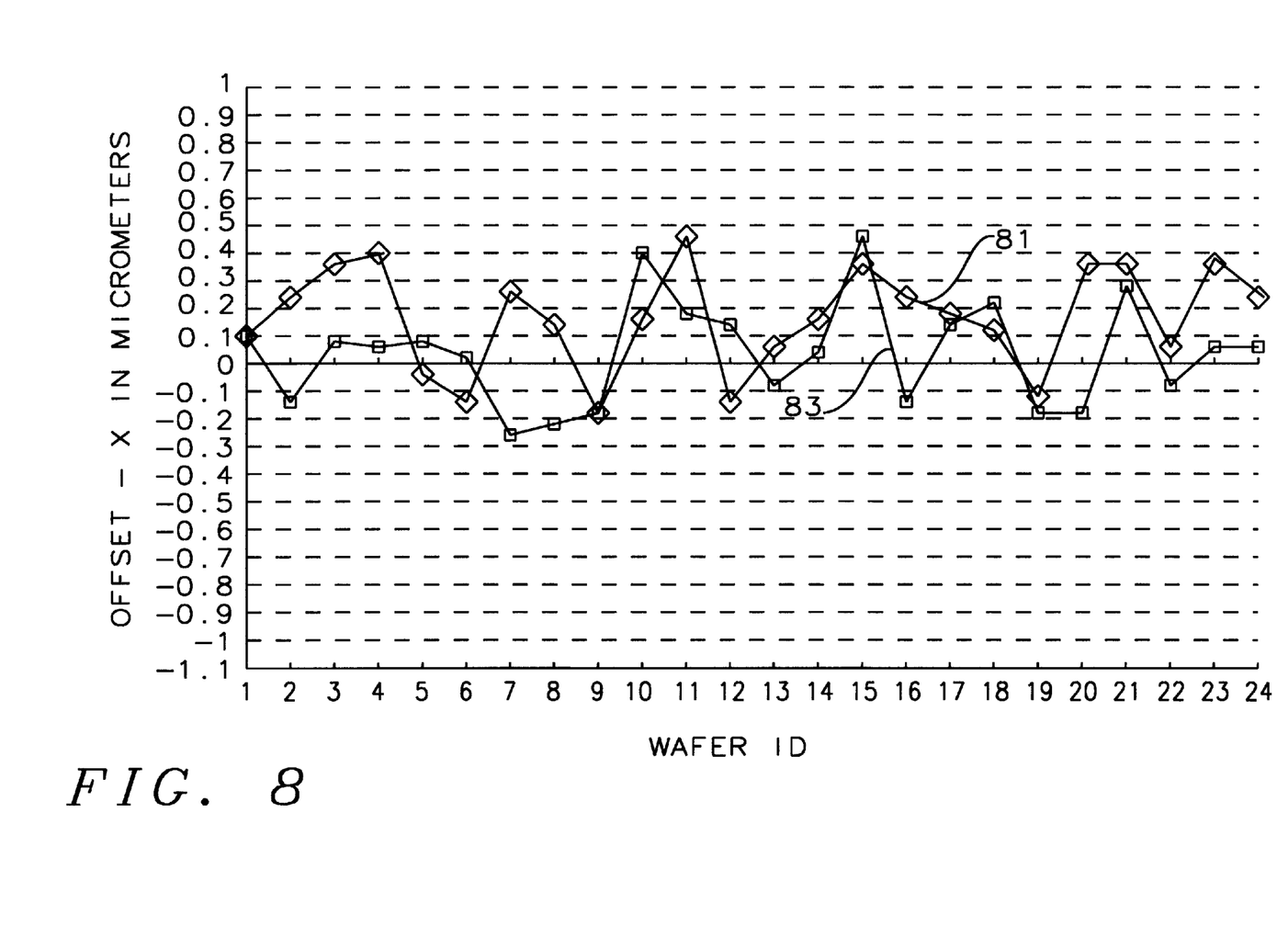
FIG. 8 shows offset data in the X direction for 24 wafers processed using the apparatus and method of this invention.
Figure 9:
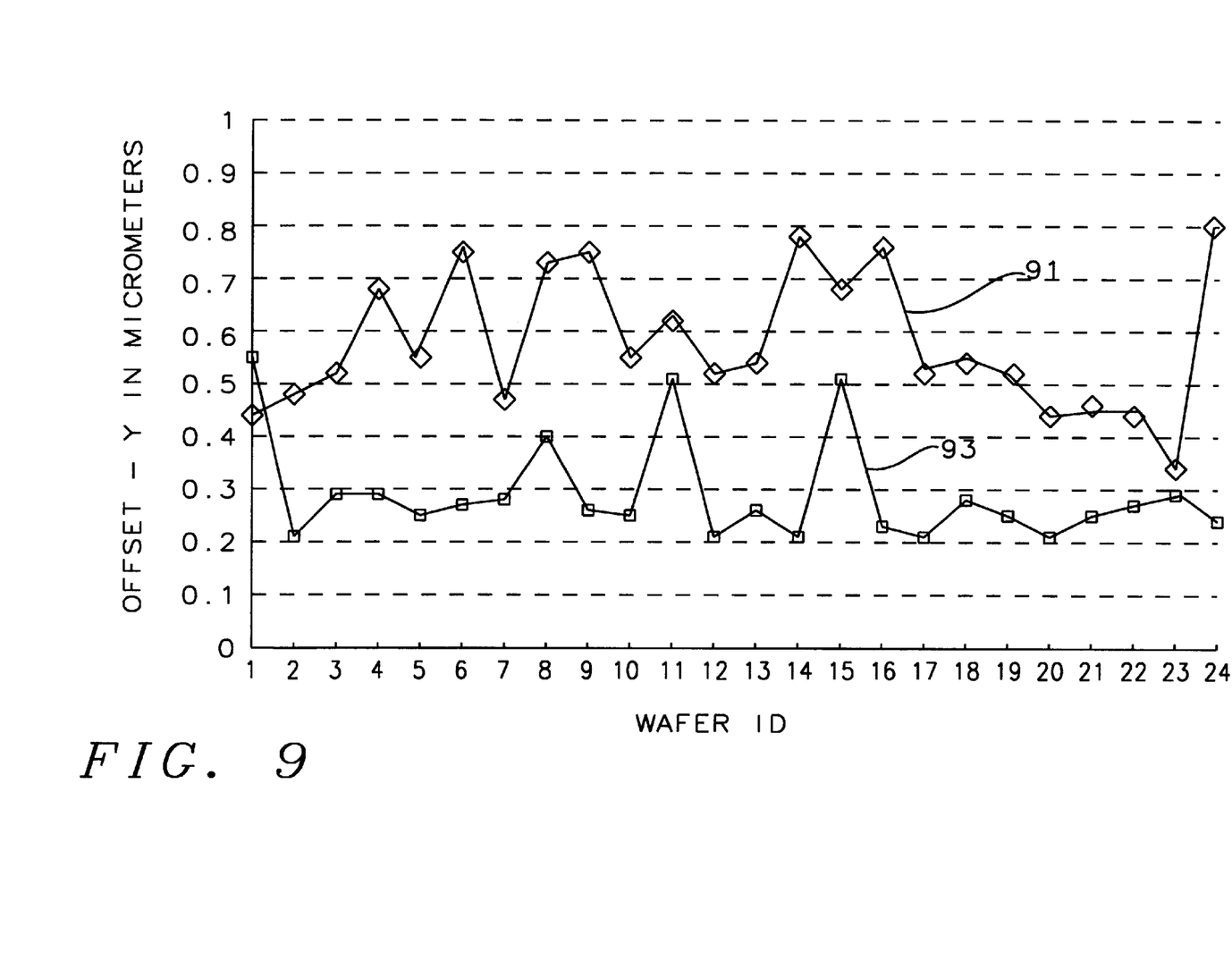
FIG. 9 shows offset data in the Y direction for 24 wafers process using the apparatus and method of this invention.
Figure 10:
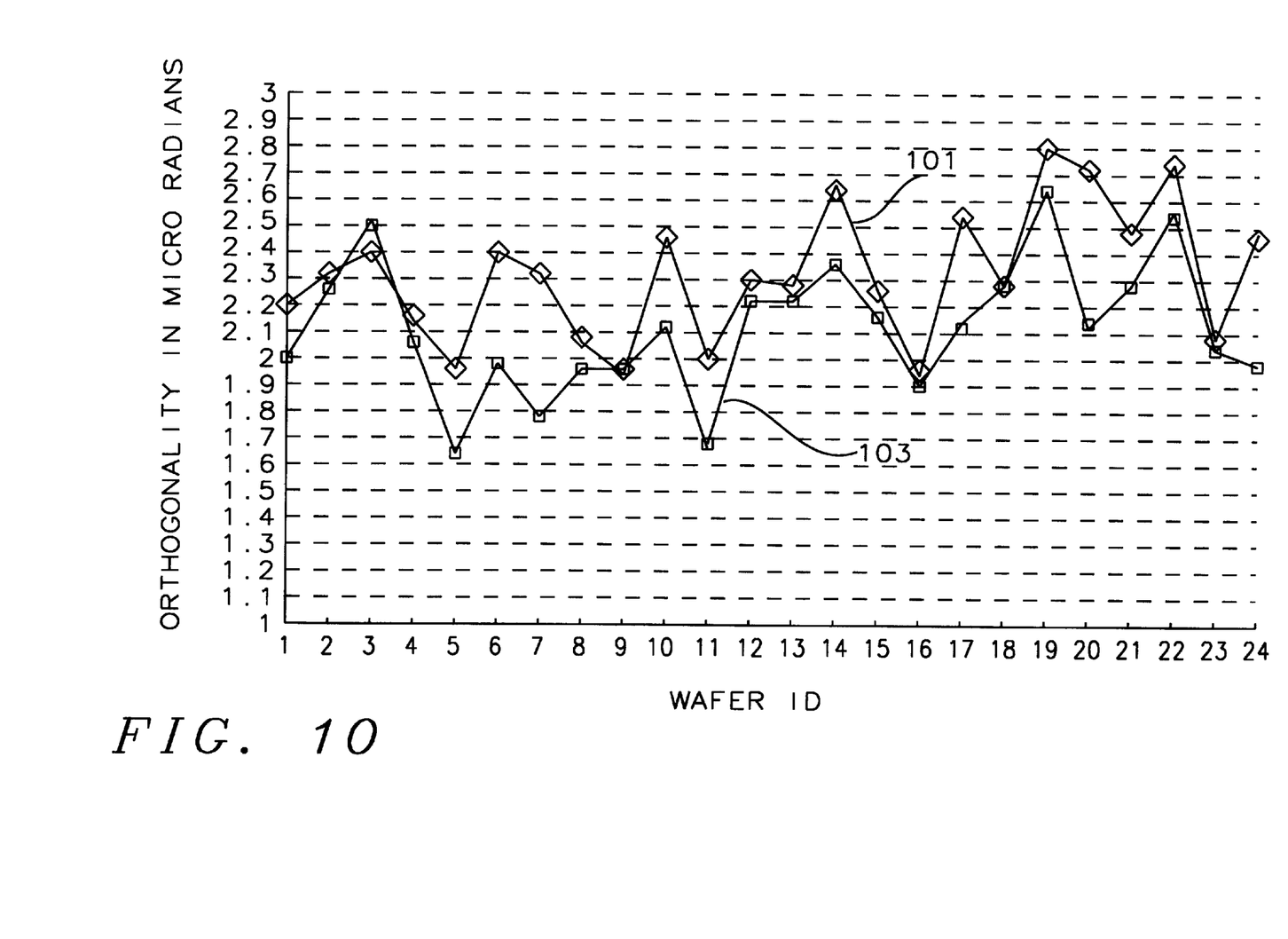
FIG. 10 shows orthogonality data for 24 wafers processed using the apparatus and method of this invention.
Figure 11:
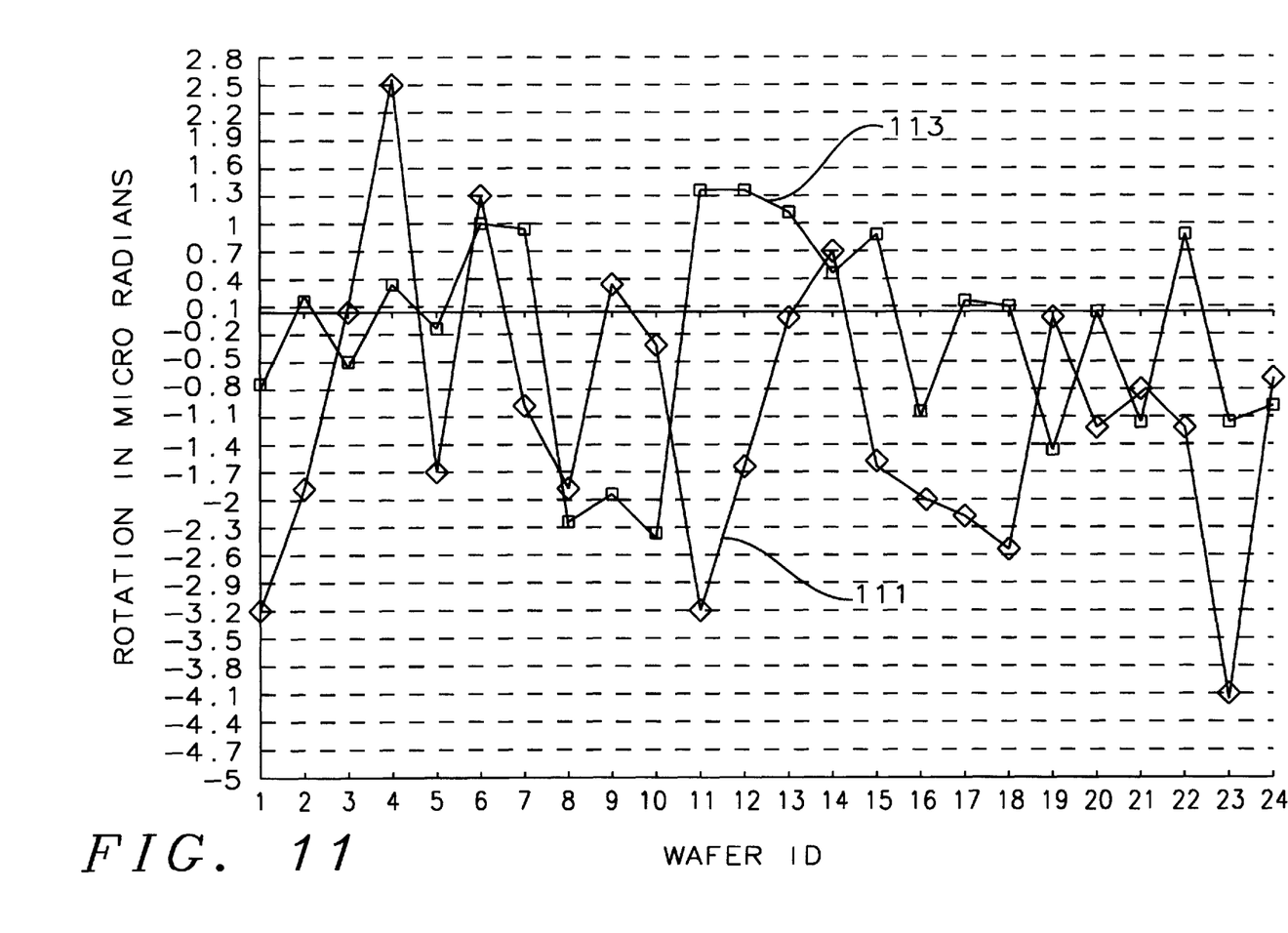
FIG. 11 shows rotation data for 24 wafers processed using the apparatus and method of this invention.

FIG. 6 shows the scaling in the X direction 61 for the alignment step prior to the step using the method of this invention and scaling in the X direction 63 for the method of this direction, in parts per million. FIG. 7 shows the scaling in the Y direction 71 for the alignment step prior to the step using the method of this invention and scaling in the Y direction 73 for the method of this direction, in parts per million. FIG. 8 shows the offset in the X direction 81 for the alignment step prior to the step using the method of this invention and offset in the X direction 83 for the method of this direction, in micro meters. FIG. 9 shows the offset in the Y direction 91 for the alignment step prior to the step using the method of this invention and offset in the Y direction 93 for the method of this direction, in micro meters. FIG. 10 shows the orthogonality 101 for the alignment step prior to the step using the method of this invention and orthogonality 103 for the method of this direction, in micro radians. FIG. 11 shows the rotation 111 for the alignment step prior to the step using the method of this invention and rotation 113 for the method of this direction, in micro radians.

While the invention has been particularly shown and described with reference to the preferred embodiments thereof, it will be understood by those skilled in the art that various changes in form and details may be made without departing from the spirit and scope of the invention.

What is claimed is:

1. A method of aligning a mask to a wafer, comprising:
providing a number of wafers wherein each of said wafers has a physical alignment feature and a unique wafer identification code formed thereon;
providing a memory unit, wherein said memory unit has alignment data for each of said number of said wafers stored therein;
providing a mask image projection system;
providing a wafer holder;
providing a mechanical controller, having data inputs, wherein said mechanical controller controls the position of said wafer holder relative to the position of said mask image projection system and said position of said wafer holder relative to the position of said mask image projection system is determined by data fed to said data inputs of said mechanical controller;
providing a detector which can detect each said unique wafer identification code;
providing a data processing unit connected to said detector, said memory unit, and data inputs of said mechanical controller, wherein said data processing unit selects alignment data for a wafer identified by said unique wafer identification code from said memory unit and provides said alignment data to said data inputs of said mechanical controller;

selecting one of said wafers;

placing said selected wafer in said wafer holder using said physical alignment features;

determining said unique wafer identification code for said selected wafer using said detector;

using said mechanical controller to align the position of said wafer holder relative to the position of said mask image projection system for said selected wafer using said data processing unit and said alignment data for said selected wafer in said memory unit to control said mechanical controller; and projecting said mask image on said selected wafer using said mask image projection system.

2. The method of claim 1 wherein said detector comprises a light source, an objective lens, and a CCD image detector.

3. The method of claim 1 wherein said mechanical controller controls the position of said wafer holder relative to the position of said mask image projection system by controlling the position of said wafer holder.

4. The method of claim 1 wherein said physical alignment feature on each of said wafers is a flat wafer edge.

5. The method of claim 1 wherein said physical alignment feature on each of said wafers is a notch at the edge of said wafer.

6. The method of claim 1 wherein said mask image projection system comprises a mask holder, a light source, and an objective lens.

7. The method of claim 1 wherein said unique wafer identification code comprises a bar code.

8. The method of claim 1 wherein said wafers are silicon integrated circuit wafers.

9. The method of claim 1 wherein said mechanical controller controls linear motion in two orthogonal directions in a plane, rotation in said plane, and tilt angle relative to said plane of said wafer holder relative to said mask image projection system.

10. The method of claim 1 wherein said alignment data for a wafer identified by said unique wafer identification code comprises alignment data for the immediately preceding mask image exposure step.

11. An apparatus for aligning a mask to a wafer, comprising:

a memory unit, wherein said memory unit has alignment data for each of a number of wafers, each said wafer having a physical alignment feature and a unique identification code, stored therein;

a mask image projection system;

a wafer holder holding a selected wafer from said number of said wafers, wherein said wafer is positioned in said wafer holder using said physical alignment feature;

a mechanical controller, having data inputs, wherein said mechanical controller controls the position of said wafer holder relative to the position of said mask image projection system and said position of said wafer holder relative to the position of said mask image projection system is determined by data fed to said data inputs of said mechanical controller;

a detector which can detect each said unique wafer identification code and thereby identify said selected wafer; and a data processing unit connected to said detector, said memory unit, and said data inputs of said mechanical controller, wherein said data processing unit selects alignment data for said selected wafer from said memory unit and provides said alignment data to said data inputs of said mechanical controller thereby adjusting the position of said wafer holder relative to the position of said mask image projection system for said selected wafer.

12. The apparatus of claim 11 wherein said detector comprises a light source, an objective lens, and a CCD image detector.

13. The apparatus of claim 11 wherein said mechanical controller controls the position of said wafer holder relative to the position of said mask image projection system by controlling the position of said wafer holder.

14. The apparatus of claim 11 wherein said physical alignment feature on each of said wafers is a flat wafer edge.

15. The apparatus of claim 11 wherein said physical alignment feature on each of said wafers is a notch at the edge of said wafer.

16. The apparatus of claim 11 wherein said mask image projection system comprises a mask holder, a light source, and an objective lens.

17. The apparatus of claim 11 wherein said unique wafer identification code comprises a bar code.

18. The apparatus of claim 11 wherein said wafers are silicon integrated circuit wafers.

19. The apparatus of claim 11 wherein said mechanical controller controls linear motion in two orthogonal directions in a plane, rotation in said plane, and tilt angle relative to said plane of said wafer holder relative to said mask image projection system.

20. The apparatus of claim 11 wherein said alignment data for a wafer identified by said unique wafer identification code comprises alignment data for the immediately preceding mask image exposure step.

* * * * *